United States Patent
Elers et al.

(10) Patent No.: US 6,863,727 B1
(45) Date of Patent: Mar. 8, 2005

(54) METHOD OF DEPOSITING TRANSITION METAL NITRIDE THIN FILMS

(75) Inventors: Kai-Erik Elers, Helsinki (FI); Suvi Päivikki Haukka, Helsinki (FI); Ville Antero Saanila, Helsinki (FI); Sari Johanna Kaipio, Järvenpää (FI); Pekka Juha Soininen, Espoo (FI)

(73) Assignee: ASM International N.V., Bilthoven (NL)

( * ) Notice: Subject to any disclaimer, the term of this patent is extended or adjusted under 35 U.S.C. 154(b) by 162 days.

(21) Appl. No.: 10/110,730

(22) PCT Filed: Oct. 13, 2000

(86) PCT No.: PCT/FI00/00895

§ 371 (c)(1),
(2), (4) Date: Apr. 11, 2002

(87) PCT Pub. No.: WO01/27347

PCT Pub. Date: Apr. 19, 2001

(30) Foreign Application Priority Data

Oct. 15, 1999 (FI) .............................................. 19992234

(51) Int. Cl.⁷ .............................................. C30B 25/14
(52) U.S. Cl. .............................. 117/93; 117/88; 117/89; 117/102
(58) Field of Search .............................. 117/88, 104, 89, 117/93, 102

(56) References Cited

U.S. PATENT DOCUMENTS

| 4,058,430 A | 11/1977 | Suntola et al. |
| 5,342,652 A | 8/1994 | Foster et al. |
| 5,691,235 A | 11/1997 | Meikle et al. |
| 5,711,811 A | 1/1998 | Suntola et al. |
| 5,723,384 A | 3/1998 | Park et al. |
| 5,916,365 A * | 6/1999 | Sherman ....................... 117/92 |
| 6,576,053 B1 * | 6/2003 | Kim et al. ..................... 117/89 |
| 6,616,982 B2 * | 9/2003 | Merrill et al. .............. 427/496 |
| 6,652,924 B2 * | 11/2003 | Sherman ..................... 427/576 |
| 6,727,169 B1 * | 4/2004 | Raaijmakers et al. ....... 438/622 |

FOREIGN PATENT DOCUMENTS

| EP | 0 899 779 A2 | 3/1999 |
| JP | 8 264 530 A | 10/1996 |

OTHER PUBLICATIONS

Elers et al., "NbC15 as a precursor in atomic layer epitaxy," *Applied Surface Science,* 82/83:468–474 (1994).

Hiltunen et al., "Nitrides of titanium, niobium, tantalum and molybdenum grown as thin films by the atomic layer epitaxy method," *Thin Solid Films,* 166:149–154 (1988).

Ritala et al., "atomic layer epitaxy growth of TiN thin Films," *J. Electrochem. Soc.,* 142(8):2731–2737 (1995).

(List continued on next page.)

*Primary Examiner*—Nadine G. Norton
*Assistant Examiner*—Matthew Anderson
(74) *Attorney, Agent, or Firm*—Knobbe, Martens, Olson & Bear LLP.

(57) ABSTRACT

This invention concerns a method for depositing transition metal nitride thin films by an Atomic Layer Deposition (ALD) type process. According to the method vapor-phase pulse of a source material, a reducing agent capable of reducing metal source material, and a nitrogen source material capable of reacting with the reduced metal source material are alternately and sequentially fed into a reaction space and contacted with the substrate. According to the invention as the reducing agent is used a boron compound which is capable of forming gaseous reaction byproducts when reacting with the metal source material.

32 Claims, 1 Drawing Sheet

OTHER PUBLICATIONS

Jeon, H., "A Study on the Charactertics of TiN Thin Film Deposited by Atomic Layer Chemical Vapor Deposition Method," *AVS 46th International Symposium,* Seattle, WA, abstract TF–MoP17 (1999).

Jeon, H., et al., "A Study on the Characteristics of TiN Thin Film Deposited by Atomic Layer Chemical Vapor Deposition Method," *J. Vac. Sci. Technol. A,* 18(4), 1595–1598 (2000).

Klaus, J.W., et al., "Atomically controlled growth of tungsten and tungsten nitride using sequential surface reactions," *Appl. Surf. Science* 162–163; 479–471 (2000).

Klaus, J.W., et al., "Atomic layer deposition of tungsten nitride films using sequential surface reactions," *Journal of the Electrochemical Soc.,* 147(3):1175–1181 (2000).

Klaus, J.W., et al., "Atomic layer deposition of tungsten using sequential surface chemistry with a sacrifical stripping reaction," *Thin Solid Films,*360:145–153 (2000)n.

Klaus, J.W., et al., "Atomic layer deposition of tungsten and tungsten nitride using sequential surface reactions," *AVS 46th international Symposium,* Seattle, WA, abstract TF–TuM6 (1999).

\* cited by examiner

Fig. 1

METHOD OF DEPOSITING TRANSITION METAL NITRIDE THIN FILMS

REFERENCE TO RELATED APPLICATIONS

The present application is the U.S. national phase of international application number PCT/FI00/00895 and claims priority under 35 U.S.C. §119 to Finnish application number 19992234, filed Oct. 15, 1999.

BACKGROUND OF THE INVENTION

1. Field of the Invention

The present invention relates to metal nitride thin films. In particular, the invention concerns a method of growing tungsten nitride thin films by Atomic Layer Deposition (referred to as ALD hereinafter).

2. Description of Related Art

The integration level of components in integrated circuits is increasing, which rapidly brings about a need for a decrease of the size of components and interconnects. Design 15 rules are setting the feature sizes to $\leq 0.2$ μm. Complete film coverage on deep bottoms and vias is hard to obtain.

Integrated circuits contain interconnects which are usually made of aluminium or copper. Especially copper is prone to diffusion to the surrounding materials. Diffusion affects the electrical properties of the circuits and active components may malfunction. The diffusion of metals from interconnects into active parts of the device is prevented with an electrically conductive diffusion barrier layer. Favored diffusion barriers are, e.g., amorphous transition metal nitrides, such as TiN, TaN and WN. The nitrides can be non-stoichiometric because nitrogen is located in interstitial position of the lattice.

In the Chemical Vapor Deposition method (referred to as CVD hereinafter), the source materials are typically fed to reaction space together, and they react with each other when brought into contact with the substrate. It is also possible to feed one source material containing all desired reactant species to a CVD reactor, and heat it almost to a point where it decomposes thermally. When the heated gas contacts the substrate surface, a cracking reaction occurs and a film is grown. As is apparent from the above discussion, in CVD the concentration of the different source materials in the reaction space determines the growth of the film.

Atomic Layer Deposition (ALD) and, originally, Atomic Layer Epitaxy (ALE) is an advanced variation of CVD. The method name was changed from ALE into ALD to avoid possible confusion when discussing about polycrystalline and amorphous thin films. The ALD method is based on sequential self-saturated surface reactions. The method is described in detail in U.S. Pat. Nos. 4,058,430 and 5,711,811. The reactor design benefits from the usage of inert carrier and purging gases which makes the system fast.

The separation of source chemicals from each other by inert gases prevents gas-phase reactions between gaseous reactants and enables self-saturated surface reactions leading to film growth which requires neither strict temperature control of the substrates nor precise dosage control of source chemicals. Surplus chemicals and reaction byproducts are always removed from the reaction chamber before the next reactive chemical pulse is introduced into the chamber. Undesired gaseous molecules are effectively expelled from the reaction chamber by keeping the gas flow speeds high with the help of an inert purging gas. The purging gas pushes the extra molecules towards the vacuum pump used for maintaining a suitable pressure in the reaction chamber. ALD provides an excellent and automatic self-control for the film growth.

ALD has recently been used for depositing single layers of titanium nitride TiN (H. Jeon, J. W. Lee, J. H. Koo, Y. S. Kim, Y. D. Kim, D. S. Kim, "A study on the Characteristics of TiN Thin Film Deposited by Atomic Layer Chemical Vapor Deposition method", AVS 46$^{th}$ International Symposium, abstract TF-MoP17, http://www.vacuum.org/symposium/seattle/technical.html, to be presented Oct. 27, 1999 in Seattle, USA).

According to Hiltunen et al. NbN, TaN, $Ta_3N_5$, MoN and $Mo_2N$ can be grown by ALD using metal halogenides as source chemicals (L. Hiltunen, M. Leskelä, M. Mäkelä, L. Niinistö, E. Nykänen, P. Soininen, "Nitrides of Titanium, Niobium, Tantalum and Molybdenum Grown as Thin Films by the Atomic Layer Epitaxy Method", *Thin Solid Films*, 166 (1988) 149–154). The use of additional zinc vapour during the deposition has decreased the resistivity of the nitride film either by increasing the metal/nitrogen ratio or by removing oxygen from the films.

J. W. Klaus has disclosed a process for growing tungsten nitride films using an ALD method (J. W. Klaus, "Atomic Layer Deposition of Tungsten and Tungsten Nitride Using Sequential Surface Reactions", AVS 46$^{th}$ International Symposium, abstract TF-TuM6, http://www.vacuum.org/symposium/seattle/technical.html, to be presented Oct. 26, 1999 in Seattle, USA). In the process of the publication, tungsten nitride $W_2N$ is grown from $WF_6$ and $NH_3$.

In the art, tungsten compounds have been reduced by using hydrogen ($H_2$) U.S. Pat. No. 5,342,652 and EP-A2-899 779), silanes, such as $SiH_4$ (U.S. Pat. No. 5,691,235) and chlorosilanes, such as $SiHCl_3$ (U.S. Pat. No. 5,723,384).

There are, however, drawbacks related to these prior art methods. Silanes may also react with $WF_6$, thus forming tungsten silicides, such as $WSi_2$. Hydrogen can reduce a tungsten compound into tungsten metal which has too low vapor pressure for being transported in gas phase onto substrates. Traditional CVD processes may leave significant amounts of impurities in thin films, especially at low deposition temperatures.

SUMMARY OF THE INVENTION

It is an object of the present invention to eliminate the problems of the prior art and to provide a novel method of depositing transition metal nitride thin films by an ALD type process. It is a further object of the invention to provide a process for preparing diffusion barriers on metal surfaces in integrated circuits.

The invention is based on the surprising finding that by feeding into a reactor chamber, which contains a substrate, a suitable transition metal compound and, a reducing boron compound pulse and a nitrogen compound, a metal nitride film with low resistivity can be grown. According to the present invention, the reaction between the gaseous boron compound and the metal species reduces the metal compound and gives rise to gaseous reaction byproducts, which easily can be removed from the reaction space.

According to a preferred embodiment of the invention, the metal nitride thin films are grown by an ALD type process. This is carried out by sequentially feeding into a reactor chamber, which contains a substrate, alternate pulses of a suitable transition metal compound, a reducing boron compound pulse and a nitrogen compound, said boron compound and said nitrogen compound being fed after the metal compound. Thus, a metal nitride film with low resistivity can be grown in accordance with the principles of ALD method. According to the present invention, the reaction between the gaseous boron compound and the metal species bound to the surface reduces the metal compound and gives rise to gaseous reaction byproducts, which easily can be removed from the reaction space.

A diffusion barrier can be grown in an integrated circuit by depositing, during the manufacture of the integrated circuit, a metal nitride thin film on a dielectric surface or a metal surface present on the silicon wafer blank.

More specifically, the present method is characterized by what is stated in the characterizing part of claim 1.

The process for preparing diffusion barriers is characterized by what is stated in the characterizing part of claim 20.

A number of considerable advantages are achieved with the aid of the present invention Metal nitride thin films, in particular tungsten nitride thin films, can be grown at low temperatures. The boron compounds used as source materials are easy to handle and vaporise.

As mentioned above, the boron compounds formed as byproducts of the reaction between the metal species and the reducing boron compound are essentially gaseous and they exit the reactor easily when purging with an inert gas. The boron residues in the film are on a very low level, typically below 5 wt-%, preferably 1 wt-% or less and in particular 0.5 wt-% or less. The resistivity of the film is low. The growing rate of the film is acceptable. Also the reaction times are short, and in all it can be said that films can be grown very effectively by means of the present process.

The film grown with the present process exhibits good thin films properties. Thus, especially the metal nitride films obtained by an ALD type process have an excellent conformality even on uneven surfaces and on trenches and vias. The method also provides an excellent and automatic self-control for the film growth.

The metal nitride thin films grown by the present invention can be used, for example, as ion diffusion barrier layers in integrated circuits. Tungsten nitride stops effectively oxygen and increases the stability of metal oxide capacitors. Transition metal nitrides and especially tungsten nitride is also suitable as an adhesion layer for a metal, as a thin film resistor, for stopping the migration of tin through via holes and improving the high-temperature processing of integrated circuits.

Next, the invention is described in detail with the aid of the following detailed description and by reference to the attached drawing.

DETAILED DESCRIPTION OF THE INVENTION

Definitions

For the purposes of the present invention, a "chemical gaseous deposition process" designates a deposition process in which the reactants are fed to a reaction space in vapor phase. Examples of such processes include CVD and ALD.

For the purposes of the present invention, an "ALD type process" designates a process in which deposition of vaporized material onto a surface is based on sequential self-saturating surface reactions. The principle of ALD process is disclosed, e.g., in U.S. Pat. No. 4,058,430.

"Reaction space" is used to designate a reactor or reaction chamber in which the conditions can be adjusted so that the deposition by ALD is possible.

"Thin film" is used to designate a film which is grown from elements or compounds that are transported as separate ions, atoms or molecules via vacuum, gaseous phase or liquid phase from the source to the substrate. The thickness of the film depends on the application and it varies in a wide range, e.g., from one molecular layer to 800 nm, even up to 1000 nm.

The Deposition Process

According to the present invention, metal nitride thin films are prepared by ALD type process.

According to CVD process, a film is grown on a substrate placed in a reaction chamber at elevated temperatures. The principles of CVD are well known to those skilled in the art. The metal source material, the nitrogen source material and the reducing boron compound are typically fed to the reaction space essentially simultaneously, although the duration of the pulsing of the different species may vary. It is also possible to feed a source material comprising both the nitrogen and metal to the reaction space together with the reducing boron compound.

According to the present invention, metal nitride thin films are prepared by the ALD process. Thus, a substrate placed in a reaction chamber is subjected to sequential, alternately repeated surface reactions of at least two vapor-phase reactants for the purpose of growing a thin film thereon. Metal compounds used as source materials are reduced by boron compounds on a substrate maintained at an elevated temperature. The boron compounds, on the other hand, are not incorporated into the film. The reduced metal species react on the surface with gaseous or volatile nitrogen source material.

The conditions in the reaction space are adjusted so that no gas-phase reactions, i.e., reactions between gaseous reactants, occur, only surface reactions, i.e., reactions between species adsorbed on the surface of the substrate and a gaseous reactant. Thus, the molecules of the reducing boron compound react with the deposited metal source compound layer on the surface, and the nitrogen source material reacts with the reduced metal compound on the surface.

According to the present process the vapor-phase pulses of the metal source material and the reducing agent are alternately and sequentially fed to the reaction space and contacted with the surface of the substrate fitted into the reaction space. The "surface" of the substrate comprises initially the surface of the actual substrate material which optionally has been pretreated in advance, e.g., by contacting it with a chemical for modifying the surface properties thereof During the growing of the thin films, the previous metal nitride layer forms the surface for the following metal nitride layer. The reagents are preferably fed into the reactor with the aid of an inert carrier gas, such as nitrogen.

Preferably, and to make the process faster, the metal source material pulse, the reducing boron compound pulse and the nitrogen source material pulse are separated from each other by an inert gas pulse, also referred to as gas purge in order to purge the reaction space from the unreacted residues of the previous chemical. The inert gas purge typically comprises an inactive gas, such as nitrogen, or a noble gas, such as argon.

Figure 1:
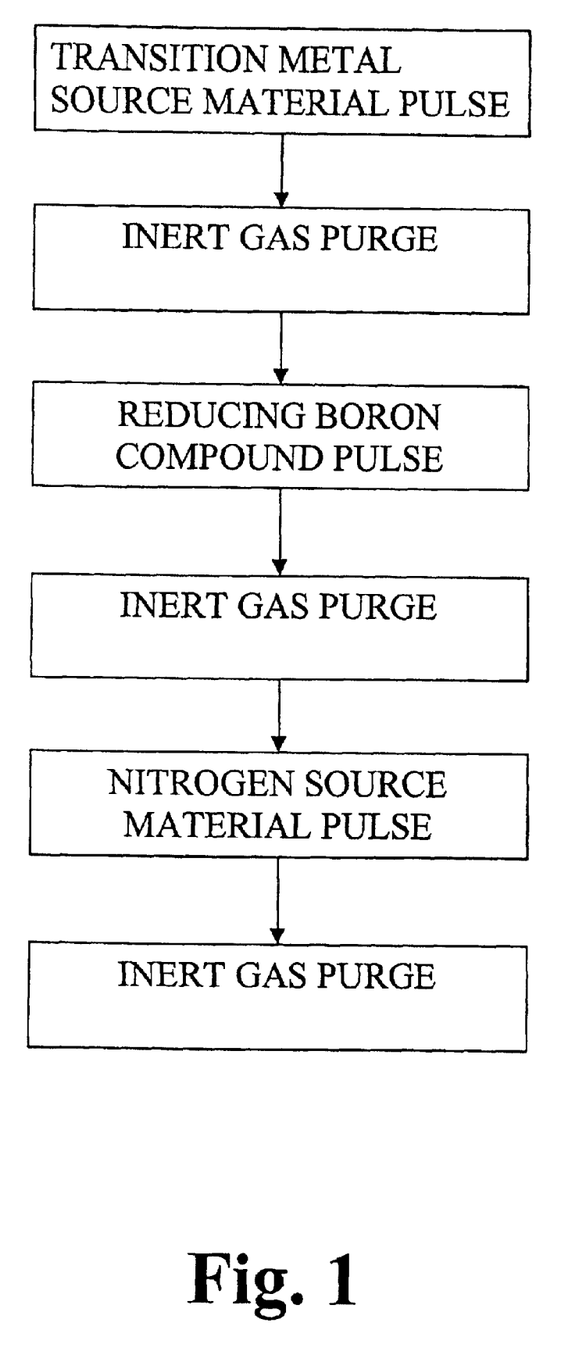
FIG. 1 presents a block diagram of a pulsing sequence according to a preferred embodiment of the invention.

Thus, one pulsing sequence (also referred to as a "cycle") preferably consists essentially of feeding a vapor-phase pulse of a metal source chemical with the help of an inert carrier gas into the reaction space;

purging the reaction space with an inert gas;
feeding a vapor-phase pulse of a boron source chemical with the help of an inert carrier gas into the reaction space;
purging the reaction space with an inert gas;
feeding a vapor-phase pulse of a nitrogen source material into the reaction space; and
purging the reaction space with an inert gas;

The purging time is selected to be long enough to prevent gas phase reactions and to prevent transition metal nitride thin film growth rates higher than one lattice constant of said nitride per cycle.

The deposition can be carried out at normal pressure, but it is preferred to operate the method at reduced pressure. The pressure in the reactor is typically 0.01–20 mbar, preferably 0.1–5 mbar. The substrate temperature has to be low enough to keep the bonds between thin film atoms intact and to prevent thermal decomposition of the gaseous reactants. On the other hand, the substrate temperature has to be high enough to keep the source materials in gaseous phase, i.e., condensation of the gaseous reactants must be avoided. Further, the temperature must be sufficiently high to provide the activation energy for the surface reaction. Depending on the reactants and the pressure the temperature of the substrate is typically 200–700° C., preferably 250–500° C.

At these conditions, the amount of reactants bound to the surface will be determined by the surface. This phenomenon is called "self-saturation".

Maximum coverage on the substrate surface is obtained when a single layer of metal source chemical molecules is adsorbed. The pulsing sequence is repeated until a metal nitride film of predetermined thickness is grown.

The source temperature is preferably set below the substrate temperature. This is based on the fact that if the partial pressure of the source chemical vapor exceeds the condensation limit at the substrate temperature, controlled layer-by-layer growth of the film is lost.

The amount of time available for the self-saturated reactions is limited mostly by the economical factors such as required throughput of the product from the reactor. Very thin films are made by relatively few pulsing cycles and in some cases this enables an increase of the source chemical pulse times and, thus, utilization of the source chemicals with a lower vapor pressure than normally.

The substrate can be of various types. Examples include silicon, silica, coated silicon, copper metal, and various nitrides, such as metal nitrides. Conventionally, the preceding thin film layer deposited will form the substrate surface for the next thin film.

The present method provides for growing of conformal layers in geometrically challenging applications. As mentioned above, it is possible to produce diffusion barriers on dielectric (e.g. silica or nitride) or metal (e.g. copper) surfaces in integrated surfaces. In these cases, said surfaces form the substrates for the growing of the metal nitride thin films.

The metal source material can attach on a nitride surface more easily if there are certain active groups on the surface. In the following is presented suggested reaction equations of tungsten hexafluoride ($WF_6$) for the attaching to silicon wafers.

Silicon wafers have a native oxide on top. The silica ($SiO_2$) layer may be just a few molecular layers thick. On a silica surface there are "—OH" groups which can serve as reactive surface sites.

(R1)

During the growth process, the metal source compound attaches to the nitride surface. Suggested reaction equations for $WF_6$ are presented in R2 and R3.

(R2)

(R3)

It is of importance that the process parameters are carefully optimised to protect silicon wafer against corrosion especially during the first phase of the nitride growth, since the evolved HF gas can attack silica and form volatile silicon tetrafluoride.

(R4)

The uncovered silicon is prone to further, undesired, reactions.

The metal source materials most typically used are volatile or gaseous compounds of transition metals, i.e., elements of groups 3, 4, 5, 6, 7, 8, 9, 10, 11 and/or 12 (according to the system recommended by IUPAC) in the periodic table of elements. In particular, the film consists essentially of W, Ti, Zr, Hf, V, Nb, Ta, Cr and/or Mo nitride(s) and thus gaseous or volatile compounds of these are preferably used in the method of the present invention.

Since the properties of each metal compound vary, the suitability of each metal compound for the use in the process of the present invention has to be considered. The properties of the compounds are found, e.g., in N. N. Greenwood and A. Earnshaw, *Chemistry of the Elements*, $1^{st}$ edition, Pergamon Press, 1986.

The metal source material (as well as the reducing boron compound and the nitrogen source material) has to be chosen so that the requirements for sufficient vapor pressure, the above-discussed criteria of sufficient thermal stability at substrate temperature and sufficient reactivity of the compounds are fulfilled.

Sufficient vapor pressure means that there must be enough source chemical molecules in the gas phase near the substrate surface to enable fast enough self-saturated reactions at the surface.

In practice, sufficient thermal stability means that the source chemical itself must not form growth-disturbing condensable phases on the substrates or leave harmful levels of impurities on the substrate surface through thermal decomposition. Thus, one aim is to avoid non-controlled condensation of molecules on substrates.

Further selecting criteria include the availability of the chemical at high purity, and the ease of handling, inter al., without severe precautions.

Typically, suitable metal source materials can be found among halides, preferably fluorides, chlorides, bromides or iodides, or metal organic compounds, preferably alkylaminos, cyclopentadienyls, dithiocarbamates or betadiketonates of desired metal(s).

According to a preferred embodiment of the invention, tungsten nitride ($W_xN_y$, referred to as WN hereinafter) is grown. Then, tungsten source chemical is a tungsten compound selected according to the above criteria. Preferably, the tungsten source material is selected from the group comprising a halide such as $WF_x$, $WCl_y$, $WBr_m$ or $WI_n$ wherein x, y, m and n are integers from 1 to 6, in particular $WF_6$;

a carbonyl such as tungsten hexacarbonyl $W(CO)_6$ or tricarbonyl(mesitylene)tungsten;

cyclopentadienyl such as bis(cyclopentadienyl)tungsten dihydride, bis(cyclopentadienyl)tungsten dichloride or bis(cyclopentadienyl)ditungsten hexacarbonyl; and β-diketonate.

According to a preferred embodiment transition metal nitrides are mixed so that in the growing process two or more different metal source materials are used. For example, tungsten nitride can be mixed with TiN.

The metal reactant will react with the substrate surface forming a (covalent) bond to the surface bonding groups. The adsorbed metal species will contain a residue of the reactant compound, such as halogen or hydrocarbon. According to the present invention, this residue reacts with the gaseous boron compound, which reduces the metal compound on the surface.

The reducing strengths of the boron compounds vary. Thus, some boron compounds may reduce the metal compound to elemental metal, and others to a certain oxidation state. It is important that only those metals which are reactive with the nitrogen compounds also in their elemental form are reduced to metals. Typically, the oxidation state of the metal source compound is reduced so that the metal on the surface is in a form of a compound. The metal compounds react with the nitrogen source materials easily forming metal nitrides.

The boron sources are selected bearing in mind the same criteria as for the metal source materials. In general, the boron compound can be any volatile, thermally sufficiently stable and reactive boron compound capable of reducing the metal species bonded to the surface.

The reactions of different metal source materials with one and same reducing agent (and vice versa) can lead to different reaction (by)products. According to the present invention, the metal source material and boron compound are selected so that the resulting boron compound(s) is (are) gaseous. By this is meant that the compound formed is gaseous enough to be moved from the reaction space with the aid of the inert purging gas, and, on the other hand, does not decompose, e.g., catalytically or thermally, to condensable species. In all, byproducts will not remain as impurities in the films. If a reactive site on the surface is contaminated, the growing rate of the film decreases. By selecting the metal source material(s) and boron compound as indicated above, the growing rate of the film does not essentially decrease, i.e., decreases by a maximum of 0.1%, preferably by less than 0.01%, and in particular by less than 0.001% in each cycle. An example of an unsuitable pair is $TiCl_4$ and triethyl boron, the reaction thereof not leading to desired results.

The selection can be facilitated with computer programs having a sufficiently extensive thermodynamics database, which enables to check the reaction equilibrium and thus predict which reactants have thermodynamically favorable reactions. An example of this kind of programs is HSC Chemistry, version 3.02 (1997) by Outokumpu Research Oy, Pori, Finland.

A vast range of boron chemicals makes it possible to choose suitable reducing strength and avoid boride formation. It is possible to use one or more boron compounds in the growing of one and same thin film.

Preferably, one or more of the following boron compounds is used:

Boranes having formula (I)

wherein n is an integer from 1 to 10, preferably from 2 to 6, and x is an even integer, preferably 4, 6 or 8, or formula (II)

(II)

wherein n is an integer from 1 to 10, preferably from 2 to 6, and m is an integer different than n, m being from 1 to 10, preferably from 2 to 6.

Boranes according to formula (I) are exemplified by nido-boranes ($B_nH_{n+4}$), arachno-boranes ($B_nH_{n+6}$) and hypho-boranes ($B_nH_{n+8}$). Of the boranes according to formula (II), examples include conjuncto-boranes ($B_nH_m$). Also borane complexes, such as $(CH_3CH_2)_3N.BH_3$ can be used.

Borane halides, particularly fluorides, bromides and chlorides. As an example of a suitable compound $B_2H_5Br$ should be mentioned. It is also possible to use borane halide complexes Boron halides with high boron/halide ratio, such as $B_2F_4$, $B_2Cl_4$ and $B_2Br_4$.

Halogenoboranes according to formula (III)

(III)

wherein X is Cl or Br and n=4, 8–12 when X=Cl, and n=7–10 when X=Br

Carboranes according to formula (IV)

(IV)

wherein n is an integer from 1 to 10, preferably from 2 to 6, and x is an even integer, preferably 2, 4 or 6.

Examples of carboranes according to formula (IV) include closo-carboranes ($C_2B_nH_{n+2}$), nido-carboranes ($C_2B_nH_{n+4}$), and arachno-carboranes ($C_2B_nH_{n+6}$).

Amine-borane adducts according to formula (V)

(V)

wherein R is linear or branched $C_1$–$C_{10}$, preferably $C_1$–$C_4$ alkyl or H, and X is linear or branched $C_1$–$C_{10}$, preferably $C_1$–$C_4$ alkyl, H or halogen, Aminoboranes where one or more of the substituents on B is an amino group according formula (VI)

(VI)

wherein R is linear or branched $C_1$–$C_{10}$, preferably $C_1C_4$ alkyl or substituted or unsubstituted aryl group.

An example of suitable aminoborane is $(CH_3)_2NB(CH_3)_2$.

Cyclic borazine (—BH—NH—)$_3$ and its volatile derivatives.

Alkyl borons or alkyl boranes, wherein the alkyl is typically linear or branched $C_1$–$C_{10}$ alkyl, preferably $C_2$–$C_4$ alkyls. Particularly preferred is triethyl boron $(CH_3CH_2)_3B$, because it is easily vaporized.

Particularly preferred boron compound is triethyl boron $(CH_3CH_2)_3B$.

The reduced metal species bound on the substrate surface will then be subjected to reaction with a nitrogen-containing compound. The nitrogen compound used as the nitrogen source material is volatile or gaseous and chosen according to the above criteria, including the criterion relating to the reaction byproducts.

Preferably, the nitrogen compound is selected from the group comprising ammonia ($NH_3$) and its salts, preferably halide salt, in particular ammonium fluoride or ammonium chloride;

hydrogen azide ($HN_3$) and the alkyl derivates of the said compound such as $CH_3N_3$;

hydrazine ($N_2H_4$) and salts of hydrazine such as hydrazine hydrochloride;

alkyl derivates of hydrazine such as dimethyl hydrazine;

nitrogen fluoride $NF_3$;

hydroxyl amine ($NH_2OH$) and its salts such as hydroxylamine hydrochloride;

primary, secondary and tertiary amines such as methylamine, diethylamine and triethylamine; and nitrogen radicals such as $NH_2*$, $NH$ and $N*$, wherein * means a free electron capable of bonding, and excited state of nitrogen ($N_2*$).

When no reducing agent is used, the nitride film resulting from the above-described process has a N/W molar ratio of greater than 1, i.e., the nitride is mostly in the form $WN_2$. When operating without a reducing agent, it is also possible to feed the nitrogen source material pulse into the reaction space first and the transition metal source material second, i.e., use a reverse order of source material pulses. The deposition process ends also in this case with a nitrogen source material pulse. Thus, the structure of the film is different from the one obtained by a process otherwise similar but employing a reducing agent. The film produced according to the process employing no reducing agent, has rather high resistivity.

The following non-limiting examples illustrate the invention.

EXAMPLE 1

Tungsten hexafluoride ($WF_6$) and ammonia ($NH_3$) were used as source chemicals. Both chemicals are liquefied gases at room temperature and posses high enough vapor pressure without additional heating for the ALD process. Source tubing and the reactor were purged with nitrogen gas which had a purity of 99.9999% (i.e. 6.0). The $N_2$ gas was prepared from liquid nitrogen. A 200-mm silicon wafer was loaded to an ALD reactor as described in Finnish Patent No. 100409 of assignee. Source chemicals were pulsed alternately to the substrates at the reaction chamber. The deposition was started and ended with an $NH_3$ pulse. The pulsing cycle consisted of the following steps:

$NH_3$ vapor pulse 0.5 s
$N_2$ gas purge 1.0 s
$WF_6$ vapor pulse 0.25 s
$N_2$ purge 0.8 s The pulsing cycle was repeated for 500 times which produced a 30 nm film with the typical growth rate of 0.6 Å/cycle. The composition, impurities and the thickness of the resulting thin film were analyzed by Electron Diffraction Spectroscopy (referred to as RDS hereinafter). EDS showed an N/W ratio of 1.3 which means that the phase of tungsten nitride was between WN and $WN_2$, i.e. rich in nitrogen. Decreasing the growth temperature from 400° C. to 360° C. increased the fluorine content from 2 wt.-% to 4 wt.-%.

The resistivity of the tungsten nitride film was obtained by combining the thickness value with the four-point probe measurements. The resistivity of the film grown at 400° C. was 1900 $\mu\Omega$cm. High resistivity was possibly caused by the high nitrogen content of the film.

EXAMPLE 2

Tungsten hexafluoride ($WF_6$), triethylboron ($CH_3CH_2)_3B$ and ammonia ($NH_3$) were used as source chemicals. All the chemicals are liquids or liquefied gases at room temperature and poses high enough source vapor pressure without additional heating for the ALD process. Source tubing and the reactor were purged with nitrogen gas which had a purity of 99.9999% (i.e. 6.0). The $N_2$ gas was prepared from liquid nitrogen. A 200-mm silicon wafer was loaded to an F200 ALD reactor. Source chemicals were pulses alternately to the substrates at the reaction chamber. The pulsing cycle consisted of the following steps:

$WF_6$ vapor pulse 0.25 s
$N_2$ purge 0.8 s
$(CH_3CH_2)_3B$ vapor pulse 0.01 s
$N_2$ gas purge 0.5 s
$NH_3$ vapor pulse 0.25 s
$N_2$ gas purge 0.5 s The pulsing cycle was repeated for 500 times resulting in a 30-nm film at 360° C. The samples were analyzed by EDS for thickness and composition. The thin film consisted of tungsten and nitrogen while boron could not be seen in detectable amounts. There was 3 wt.-% of fluorine as an impurity in the film. The resistivity of the tungsten nitride film was obtained by combining the thickness value with the four-point probe measurements. The resistivities were 130–160 $\mu\Omega$cm.

The inventors assume that the boron chemical acted as a reducing agent and removed fluorine from tungsten fluoride. The benefit of this boron chemical is that possible byproducts such as $BF_3$ and $CH_3CH_2F$ are gaseous at the deposition temperature and do not disturb the nitride growth.

What is claimed is:

1. An atomic layer deposition (ALD) process for growing a metal nitride thin film on a substrate comprising alternately and sequentially contacting a substrate in a reaction space with vapor phase pulses of:

a metal source material that forms a monolayer on the substrate surface;

a boron compound that reduces the metal source material on the substrate surface; and a nitrogen source material that reacts with the reduced metal source material, wherein an inert gas is provided to the reaction space after every pulse.

2. An atomic layer deposition (ALD) process for growing a metal nitride film on a substrate in a reaction space comprising the sequential steps of:

a) feeding a vapor-phase pulse of a metal source chemical into the reaction space with an inert carrier gas;

b) purging the reaction space with an inert gas;

c) feeding a vapor-phase pulse of a boron source chemical into the reaction space with an inert carrier gas;

d) purging the reaction space with an inert gas;

e) feeding a vapor-phase pulse of a nitrogen source chemical into the reaction space;

f) purging the reaction space with an inert gas; and g) repeating steps a) through f) until a metal nitride film of a desired thickness is formed.

3. The process of claim 2, wherein the metal in the metal source chemical is selected from the group consisting of W, Mo, Cr, Ta, Nb, V, Hf, Zr and Ti.

4. The process of claim 2, wherein the metal source chemical is selected from the group consisting of metal halides and metal organic compounds.

5. The process of claim 4, wherein the metal source chemical is selected from the group consisting of metal fluorides, metal chlorides, metal bromides and metal iodides.

6. The process of claim 4, wherein the metal source chemical is selected from the group consisting of alkylamino compounds, cyclopentadienyl compounds, dithiocarbamate compounds and betadiketonate compounds.

7. The process of claim 2, wherein the metal source chemical is a tungsten compound selected from the group consisting of tungsten halides, tungsten carbonyls, tungsten cyclopentadienyls, and tungsten β-diketonates.

8. The process of claim 7, wherein the metal source chemical is selected from the group consisting of $WF_x$, $WCl_y$, $WBr_m$ and $WI_n$ wherein x, y, m and n are integers from 1 to 6.

9. The process of claim 8, wherein the metal source chemical is $WF_6$.

10. The process of claim 7, wherein the metal source chemical is selected from the group consisting of tungsten hexacarbonyl ($W(CO)_6$) and tricarbonyl(mesitylene) tungsten.

11. The process of claim 7, wherein the metal source chemical is selected from the group consisting of bis(cyclopentadienyl)tungsten dihydride, bis(cyclopentadienyl)tungsten dichloride and bis(cyclopentadienyl)ditungsten hexacarbonyl.

12. The process of claim 2, wherein the boron source chemical is selected from the group consisting of boranes of formula (I)

$$B_nH_{n+x}, \qquad (I)$$

wherein is an integer from 1 to 10 and x is an even integer; boranes of formula (II)

$$B_nH_m, \qquad (II)$$

wherein n is an integer from 1 to 10 and m is an integer different than n, m being from 1 to 10; and
complexes thereof.

13. The process of claim 12, wherein the boron source chemical is selected from the group consisting of boranes of formula (I)

$$B_nH_{n+x}, \qquad (I)$$

wherein n is an integer from 2 to 6, and
x is 4, 6 or 8;
boranes of formula (II)

$$B_nH_m, \qquad (II)$$

wherein n is an integer from from 2 to 6, and m is an integer different than n, m being from 2 to 6; and
complexes thereof.

14. The process of claim 12, wherein the boranes are selected from the group consisting of nido-boranes of formula $B_nH_{n+4}$, arachno-boranes of formula $B_nH_{n+6}$, hypho-boranes of formula $B_nH_{n+8}$, and conjuncto-boranes $B_nH_m$, wherein n is an integer from 1 to 10 and m is an integer from 1 to 10 that is different than n.

15. The process of claim 2, wherein the boron source chemical is selected from the group consisting of carboranes according to formula (IV)

$$C_2B_nH_{n+x}, \qquad (IV)$$

wherein n is an integer from 1 to 10 and x is an even integer.

16. The process of claim 15, wherein n is an integer from 2 to 6, and x is 2, 4 or 6.

17. The process of claim 15, wherein the carboranes are selected from the group consisting of closo-carboranes ($C_2B_nH_{n+2}$), nido-carboranes ($C_2B_nH_{n+4}$) and arachno-carboranes ($C_2B_nH_{n+6}$), wherein n is an integer from 1 to 10.

18. The process of claim 2, wherein the boron source chemical is selected from the group consisting of amine-borane adducts according to formula (V)

$$R_3NBX_3, \qquad (V)$$

wherein R is linear or branched $C_1$–$C_{10}$, and
X is linear or branched $C_1$–$C_{10}$.

19. The process of claim 18, wherein R is selected from the group consisting of linear or branched $C_1$–$C_4$ alkyl and H, and X is selected from the group consisting of linear or branched $C_1$–$C_4$ alkyl, H and a halogen.

20. The process of claim 2, wherein the boron source chemical is selected from the group consisting of aminoboranes wherein one or more of the substituents on B is an amino group according to formula (VI)

$$R_2N, \qquad (VI)$$

wherein R is linear or branched $C_1$–$C_{10}$.

21. The process of claim 20, wherein R is selected from the group consisting of a $C_1$–$C_4$ alkyl group, a substituted aryl group and an unsubstituted aryl group.

22. The process of claim 2, wherein the boron source chemical is selected from the group consisting of alkyl borons and alkyl boranes, wherein the alkyl is a linear or branched $C_1$–$C_{10}$ alkyl.

23. The process of claim 22, wherein the alkyl is a linear or branched $C_2$–$C_4$ alkyl.

24. The process of claim 2, wherein the boron source chemical is a boron halide.

25. The process of claim 24, wherein the boron source chemical is selected from the group consisting of $B_2F_4$, $B_2Cl_4$ and $B_2Br_4$.

26. The process of claim 2, wherein the boron source chemical is selected from the group consisting of halogenoboranes of formula (III)

$$B_nX_n, \qquad (III)$$

wherein X is Cl or Br, n=4, 8–12 when X=Cl and n=7–10 when X=Br.

27. The process of claim 2, wherein the boron source chemical is selected from the group consisting of cyclic borazine (—BH—NH—)$_3$ and the volatile derivatives thereof.

28. The process of claim 2, wherein the boron source chemical is selected from the group consisting of borane halides and complexes thereof.

29. The process of claim 2, wherein the nitrogen source chemical is selected from the group consisting of ammonia ($NH_3$) and its salts, hydrogen azide ($HN_3$) and the alkyl derivates thereof, hydrazine ($N_2H_4$) and salts of hydrazine, alkyl derivates of hydrazine, nitrogen fluoride $NF_3$, hydroxyl amine ($NH_2OH$) and salts thereof, primary, secondary and tertiary amines, nitrogen radicals, and excited state nitrogen ($N_2$*), wherein * is a free electron capable of bonding.

30. The process of claim 29, wherein the nitrogen source chemical is selected from the group consisting of ammonium fluoride, ammonium chloride, $CH_3N_3$, hydrazine hydrochloride dimethyl hydrazine, hydroxylamine hydrochloride, methylamine, diethylamine and triethylamine.

31. The process of claim 2, wherein the substrate comprises one or more materials selected from the group consisting of silicon, silica, coated silicon, copper metal and nitride.

32. The process of claim 2, wherein the metal nitride thin film comprises a diffusion barrier in an integrated circuit.

* * * * *

UNITED STATES PATENT AND TRADEMARK OFFICE
CERTIFICATE OF CORRECTION

| | | |
|---|---|---|
| PATENT NO. | : 6,863,727 B1 | Page 1 of 2 |
| APPLICATION NO. | : 10/110730 | |
| DATED | : March 8, 2005 | |
| INVENTOR(S) | : Elers et al. | |

It is certified that error appears in the above-identified patent and that said Letters Patent is hereby corrected as shown below:

Title Page 1 #74, Col. 2, after "Bear" please insert -- , --.

Title Page 1 #74, Col. 2, line 4, under "Abstract", please delete "pulse" and insert --pulses-- therefor.

Title Page 1 #74, Col. 2, line 4, under "Abstract", please insert --metal-- before "source".

Title Page 2 #74, Col. 2, line 9, please delete "international" and insert --International-- therefor.

In Col. 1, line 22, after "Design" please delete "15".

In Col. 1, line 23, please delete "bard" and insert --hard-- therefor.

In Col. 1, line 37, please delete "arc" and insert --are-- therefor.

In Col. 3, line 18, after "invention" please insert -- . --.

In Col. 4, line 51, after "thereof" please insert -- . --.

In Col. 5, line 8, after "gas" delete ";" and insert -- . --. therefor.

In Col. 8, line 13, after "complexes" please insert -- . --.

In Col. 9, line 51, please delete "RDS" and insert --EDS-- therefor.

In Col. 11, line 46, in Claim 13, after "integer" please delete "from".

In Col. 11, line 53, in Claim 14, after "$B_nH_{n+8}$" please delete ",".

UNITED STATES PATENT AND TRADEMARK OFFICE
CERTIFICATE OF CORRECTION

PATENT NO. : 6,863,727 B1
APPLICATION NO. : 10/110730
DATED : March 8, 2005
INVENTOR(S) : Elers et al.

It is certified that error appears in the above-identified patent and that said Letters Patent is hereby corrected as shown below:

In Col. 12, line 57, in Claim 30, after "hydrocloride" insert --,--.

Signed and Sealed this

Twenty-first Day of November, 2006

JON W. DUDAS
*Director of the United States Patent and Trademark Office*